United States Patent [19]

Ryum et al.

[11] Patent Number: 5,444,014
[45] Date of Patent: Aug. 22, 1995

[54] METHOD FOR FABRICATING SEMICONDUCTOR DEVICE

[75] Inventors: Byung-Ryul Ryum; Tae-Hyeon Han; Soo-Min Lee; Deok-Ho Cho; Seong-Hearn Lee; Jin-Young Kang, all of Daejeon, Rep. of Korea

[73] Assignees: Electronics and Telecommunications Research Institute; Korea Telecommunication Authority, both of Rep. of Korea

[21] Appl. No.: 357,021

[22] Filed: Dec. 16, 1994

[51] Int. Cl.⁶ .......................................... H01L 21/76
[52] U.S. Cl. .................................. 437/62; 437/89; 148/DIG. 12
[58] Field of Search .................. 437/62, 89; 148/DIG. 12, DIG. 85, DIG. 86

[56] References Cited

U.S. PATENT DOCUMENTS 3,929,528 12/1975 Davidson et al. .
5,298,449 3/1994 Kikuchi .

FOREIGN PATENT DOCUMENTS 57-79634 5/1982 Japan .
60-113435 6/1985 Japan .
112543 1/1989 Japan .
2214120 8/1990 Japan .

Primary Examiner—George Fourson
Attorney, Agent, or Firm—Larson and Taylor

[57] ABSTRACT

Disclosed is a method of fabricating an SOI substrate, comprising the steps of forming a first insulating layer on a single crystal silicon substrate; patterning the first insulating layer to form an opening; growing a single crystal silicon in the opening to form active and inactive regions; polishing the active region 31 as the first insulating layer as a polishing stopper to form a planarized surface; depositing a second insulating layer on the planarized surface; bonding a bonding substrate to the second insulating layer; and polishing the silicon substrate using the first insulating layer as a stopper up to a surface of the active region. By the method, a stray capacitance occurring between an SOI substrate and a metal wiring portion formed thereon can be significantly reduced owing to a relatively thick insulating layer therebetween, and a parasitic capacitance can be eliminated owing to an insulating layer interposed between a bonding substrate and an active region to be used as a buried collector.

5 Claims, 5 Drawing Sheets

METHOD FOR FABRICATING SEMICONDUCTOR DEVICE

BACKGROUND OF THE INVENTION

1. Field of the Invention

The present invention relates to fabrication of a semiconductor device, and more particularly to a method for fabricating an SOI (Silicon On Insulator) substrate in which active and field regions are electrically isolated from each other by using a selective epitaxial-growth and a direct wafer bonding, and a method for fabricating a self-aligned bipolar transistor using the SOI substrate.

2. Description of the Prior Art

As integration of a semiconductor device is improved higher, there arises a difficult problem in design of a high-speed, high-frequency semiconductor device, or an integrated circuit using the high-frequency semiconductor device. For example, since a stray capacitance occurring between a substrate and a metal wiring portion formed thereon serves as a most dominant parasitic capacitance in such a high-frequency semiconductor device, operation speed of the device is seriously lowered due to occurrence of the stray capacitance and a signal attenuation is generated. The amount of a stray capacitance is generated in inverse proportion to the thickness of an insulating between the substrate and the metal wiring portion thereon. That is, the thinner the insulating layer formed therebetween becomes, the larger the amount of the stray capacitance becomes.

To minimize such a stray capacitance, a high-resistance substrate having a specific resistance of several M$\Omega$cm or a semi-insulating semiconductor substrate such as a GaAs substrate has been used as a substrate of the high-frequency semiconductor device.

However, since the above-mentioned substrates are expensive, they are restrictively used in such a high-frequency semiconductor device. For this reason, a relatively inexpensive SOI substrate, which is composed of a silicon/insulator/silicon structure, has been mainly developed in the high-frequency semiconductor device.

In the SOI substrate, a buried insulating layer therein allows a stray capacitance occurring between the substrate and a metal wiring portion thereon to be lowered. If such an SOI substrate having a buried insulating layer is embodied in a semiconductor device, the operation speed of the device can be prevented from being lowered and occurrence of the signal attenuation can be restricted, as well-known in the art.

Prior art methods for fabricating an SOI substrate are broadly classified into an oxygen injection to a substrate and a direct substrate bonding. The former has an advantage that its sequence simplifies, and the latter has excellent advantages that adjustment of thickness of a buried oxide layer allows a stray capacitance to be further reduced, and particularly it is not necessary to perform a separate device isolation in case that an SOI substrate is embodied in an integrated circuit.

FIGS. 1A and 1B show the steps for fabricating an SOI substrate in accordance with the direct substrate bonding of the prior art fabricating methods.

Referring to FIG. 1A, first, by using a well-known photolithography, a singly crystal silicon substrate 11 is patterned to define active and inactive (i.e. field) regions and selectively etched back to form the active region 11b of a convex surface. Next, on overall surface of the substrate 11 an insulating layer 13 is deposited.

After formation of a polysilicon on the insulating layer a mechanical, chemical polishing is performed to form a planarized polysilicon layer 15, as shown in FIG. 1A.

In FIG. 1B, after bonding a bonding substrate 17 with the planarized polysilicon layer 15, polishing of the single crystal silicon substrate 11 is performed, whereby an SOI substrate is fabricated.

However, the direct bonding method for fabricating an SOI substrate is complicated in its fabrication sequence, and particularly it is necessary to perform an accurate planarization.

If an uniformly planarized surface can not be obtained during planarization, micro voids are generated between the polysilicon layer 15 and the bonding substrate 17 while bonding the bonding substrate 17 with the polysilicon layer 15, thereby resulting in lowering of a product quality.

Substantially, it is impossible to obtain a fully uniformly planarized surface of the polysilicon layer 19 by a well-known planarization in the art. It is because layers formed under the polysilicon layer 15 are not planarized. Specifically, since an area occupied by the active region 11b of the convex surface is relatively small, planarization of the polysilicon layer 15 is further lowered.

In the prior art method, the convex surface portion on the silicon substrate 11 is provided to control thickness of the active region 11b in accordance with a polishing speed difference between the silicon substrate 11 and the insulating layer 13.

On the other hand, in case that, after deposition of the insulating layer 13 without pattering the single crystal silicon substrate 11, the bonding substrate 17 is directly bonded with the silicon substrate, occurrence of micro voids can be somewhat reduced. Since the silicon substrate 11, however, must be polished to a certain thickness without a polishing stopper, it is difficult to control thickness of the active region and a uniformity thereof.

In addition, it is further difficult to make an active region having a uniformly planarized surface during fabrication of an SOI substrate capable of simultaneously performing a field isolation.

SUMMARY OF THE INVENTION

It is an object of the present invention to provide a method for fabricating an SOI substrate, in which a thin film can be fully planarized without reference to a pattern density of other thin films, i.e. uniformity of them, thereby improving a reliability of a semiconductor device provided with the SOI substrate and allowing an active region therein to be easily controlled in accordance with adjustment of thickness of respective films.

It is another object of the present invention to provide a method for fabricating a self-aligned bipolar transistor, in which a stray capacitance occurring between a substrate and a metal wiring portion formed thereon can be minimized by using an SOI substrate in which active and field regions are electrically isolated.

According to the aspect of the present invention, the method for fabricating a semiconductor device, comprising the steps of forming a first insulating layer on a single crystal silicon substrate; patterning the first insulating layer to form an opening; growing a single crystal silicon in the opening to form active and inactive regions; polishing the active region 31 as the first insulating layer as a polishing stopper to form a planarized surface; depositing a second insulating layer on the planarized surface; bonding a bonding substrate to the second insulating layer; and polishing the silicon substrate using the first insulating layer as a stopper up to a surface of the active region.

In this method, the first insulating layer is composed of a multi-layer structure.

In this method, the multi-layer structure is formed by the step of sequentially forming a silicon oxide layer of about 500 Å thickness, a polysilicon layer of about 0.1 μm and a thick oxide layer on the silicon substrate.

According to another aspect of the present invention, the method for fabricating a semiconductor device, comprising the steps of forming a first insulating layer on a single crystal silicon substrate; patterning the first insulating layer to form a first opening; growing a single crystal silicon in the first opening to form active and intrinsic regions; polishing the active region 31 as the first insulating layer as a polishing stopper to form a planarized surface; depositing a second insulating layer on the planarized surface; bonding a bonding substrate to the second insulating layer; polishing the silicon substrate using the first insulating layer as a stopper up to a surface of the active region; injecting an impurity into the active region to form a buried collector region; depositing a patterned oxide layer having a second opening on the planarized surface; growing a single crystal silicon layer doped with an impurity in the second opening to form a collector; forming a silicide layer only on the collector; forming an extrinsic base only on the field region; depositing a third insulating layer having a third opening thereon, the third opening being formed on the silicide layer; forming a first side wall on both sides of the third opening; removing the silicide layer and forming an intrinsic base at a region where the silicide layer is removed; forming a second side wall on the first side wall; forming an emitter on the intrinsic base in the third opening; and forming electrodes to be respectively connected to the emitter, collector and base.

In this method, the step of injection the impurity comprises injecting the impurity having a concentration of more than $5 \times 10^{18} cm^{-3}$.

By the method of the present invention, a stray capacitance occurring between an SOI substrate and a metal wiring portion thereon can be significantly reduced owing to a relatively thick insulating layer therebetween, and a parasitic capacitance can be eliminated owing to an insulating layer interposed between a bonding substrate and an active region to be used as a buried collector.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S).

Figure 2:
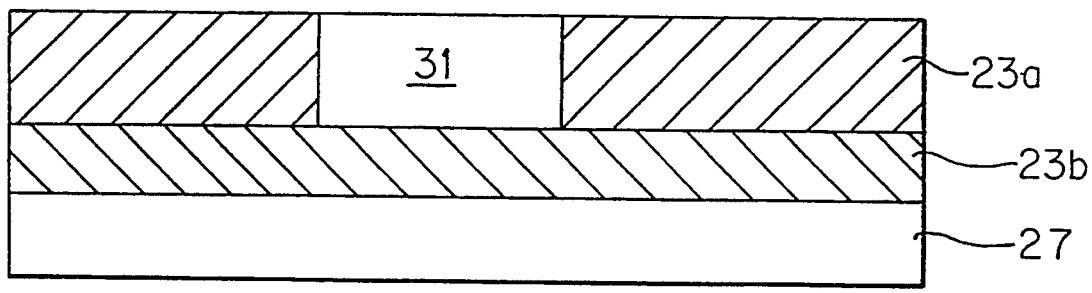
FIG. 2 is a cross-sectional view showing the construction of an SOI substrate which is fabricated in accordance with the method of the present invention.

Referring to FIG. 2, the SOI substrate fabricated by the fabricating method of the present invention has a bonding substrate 27, a first insulating layer 23b formed on the bonding substrate 27, a second insulating layer 23a formed on the first insulating layer 23b and provided with an opening, and an active region 31 of single crystal formed in the opening. The SOI substrate of FIG. 2 can be fabricated without performing a separate isolation process.

Hereinafter, the method for fabricating the SOI substrate of FIG. 2 will be described in detail with reference to FIGS. 3A to 3F.

Figure 3A:
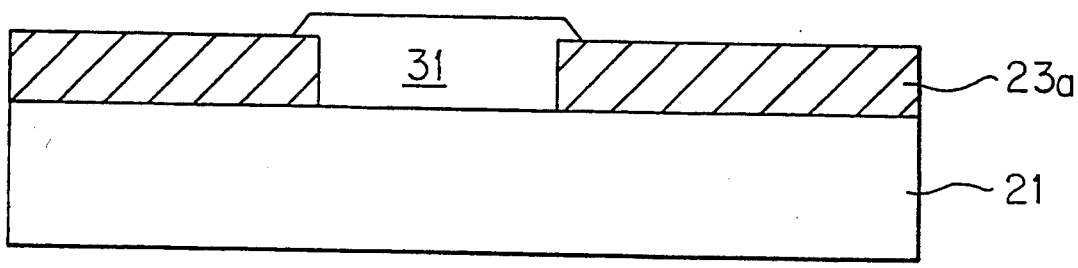
FIGS. 3A, 3A-1, 3B, 3C, 3D, 3E and 3F are cross-sectional views showing the steps of fabricating the SOI substrate of FIG. 2 in accordance with one embodiment of the present invention.

As shown in FIG. 3A, on a single crystal silicon substrate 21, an insulating layer 23a having about 2 μm thickness is deposited, and then patterned to form an opening therein. Next, a single crystal silicon layer 31 thicker than the insulating layer 23a is selectively grown in the opening to form an active region.

Figure 1A:
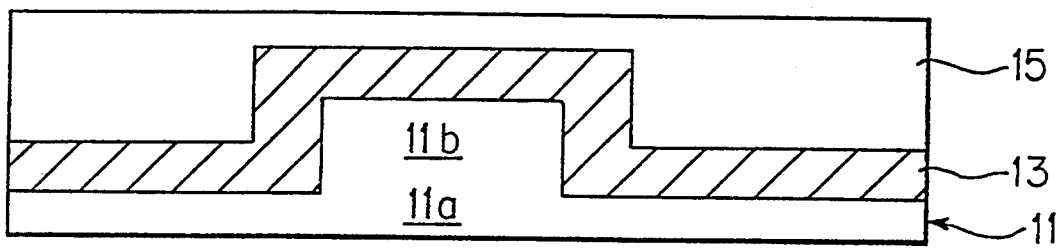
FIGS. 1A and 1B are cross-sectional views showing the steps of fabricating an SOI substrate in accordance with a prior art method.
Figure 1B:
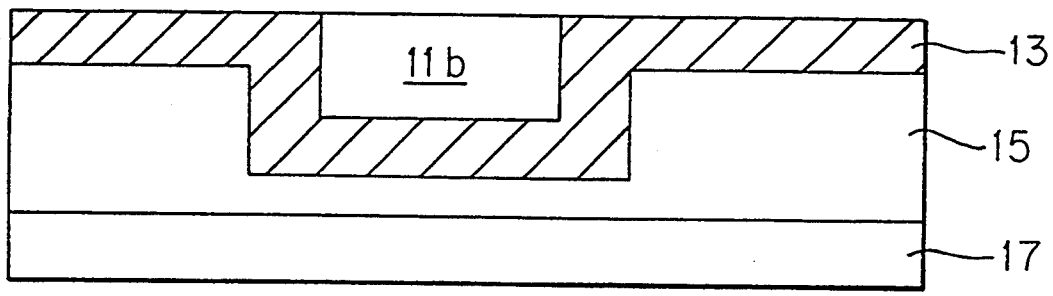

As above-described, the method of the present invention is different from the prior art method that a single crystal silicon substrate is patterned and selectively etched back to form a convex active region, as shown in FIG. 1A.

The insulating layer 23a also may be constituted by a multi-layer structure so as to prevent a surface damage occurring during patterning it.

Figures 1, 3A:
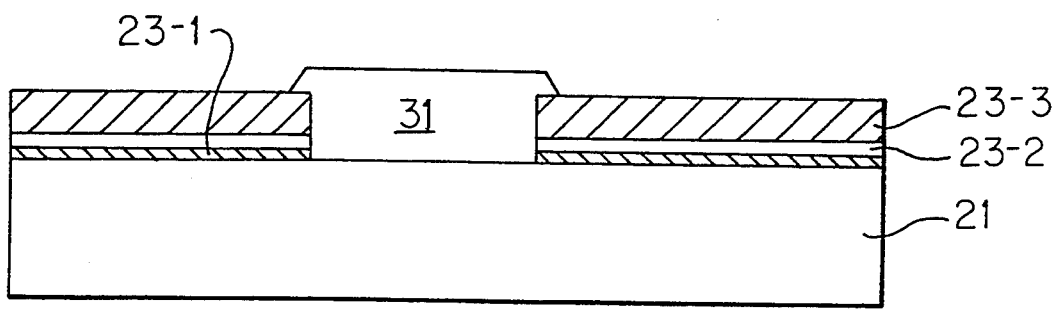

For example, as shown in FIG. 3A-1, on the silicon substrate 21, a silicon oxide layer (SiO$_2$) 23-1 of about 500 Å thickness, a polysilicon layer 23-2 of about 0.1 μm thickness and a thick oxide layer 23-3 are sequentially deposited to form a three-layer insulating layer. When the three-layer insulating layer is used to define an active region while patterning, since there is an etching speed difference between the polysilicon layer 23-2 and the oxide layer 23-3, the surface of the silicon substrate 21 can be prevented from getting damaged due to patterning of the insulating layer. Therefore, an active region having an excellent matching with a silicon substrate can be grown on the silicon substrate. Also, there is an advantage that thickness of the active layer or the insulating layer can be easily controlled.

Figure 3B:
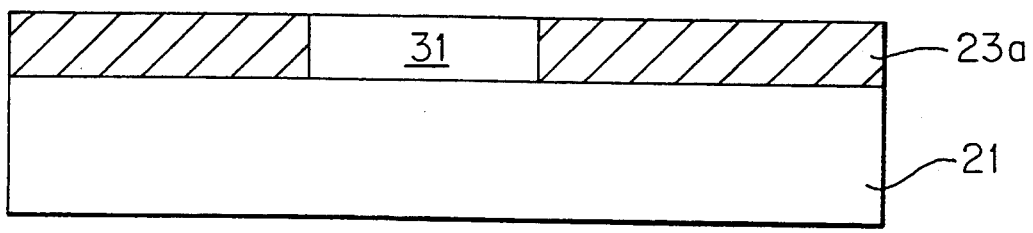

With reference to FIG. 3B, a polishing process of the active region 31 is carried out. Then, the insulating layer 23a and the active region 31 are uniformly planarized, because a polishing speed of the active region 31 is very faster than that of the insulating layer 23a.

Figure 3C:
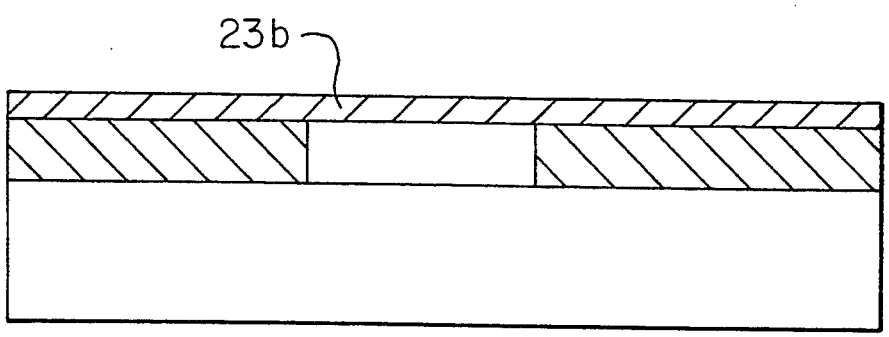
Figure 3D:
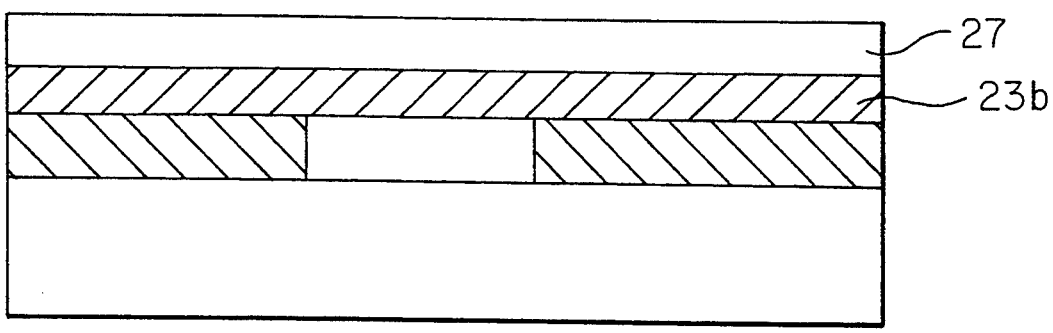

Subsequently, after depositing an insulating layer 23b on the planarized surface as shown in FIG. 3C, a bonding substrate 27 is bonded directly with the surface of the insulating layer 23b, as shown in FIG. 3D.

On the other hand, to improve a surface uniformity, a surface polishing of the insulating layer 23b may be performed separately before bonding the bonding substrate 27 with the insulating layer 23b. In this case, an insulating layer is deposited on the bonding substrate 27, and then bonded with the planarized insulating layer 23b.

Figure 3E:
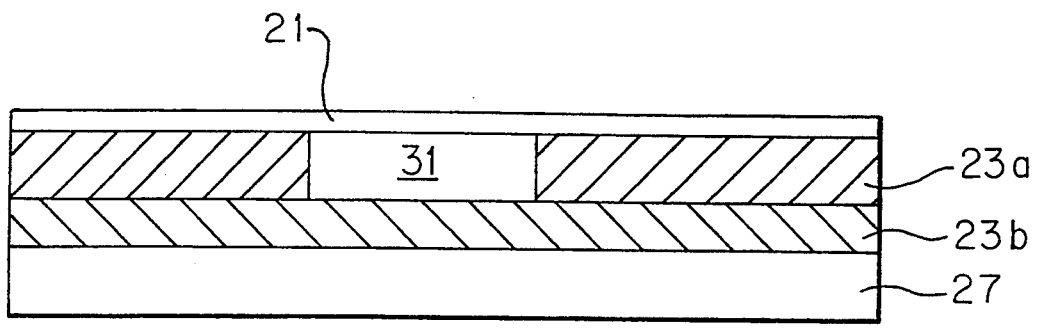
Figure 3F:
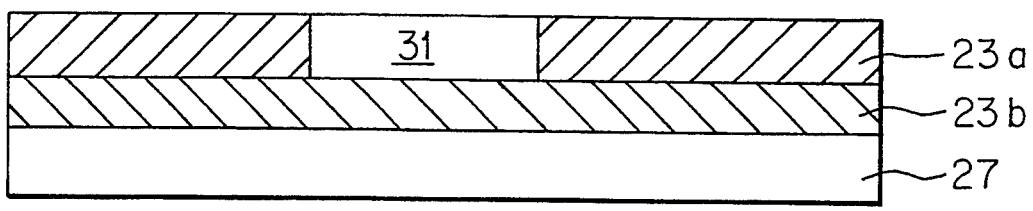

Finally, as shown in FIGS. 3E and 3F, the silicon substrate 21 is continuously polished using the insulating layer 23a as a polishing stopper up to a surface of the active region 31, and therefore the SOI substrate is fabricated. The bonding substrate 27 is used as a lower substrate of the SOI substrate.

As above described, in the SOI substrate fabricated by the method of the present invention, active and inactive (or, field) regions can be electrically isolated without performing a separate isolation process. Also, occurrence of micron voids can be restrained because thin films constituting the SOI substrate is excellent in planarization, whereby a semiconductor device excellent in reliability thereof can be obtained.

In addition, because thickness of the insulating layers 23a, 23b constituting the inactive region can be easily adjusted, a stray capacitance can be minimized between an SOI substrate and a metal wiring portion thereon when the SOI substrate is embodied in a bipolar device.

Hereinafter, the method for fabricating a bipolar transistor using the SOI substrate of FIG. 2 will be described in detail with reference to FIG. 4 and FIGS. 5A to 5H.

Figure 4:
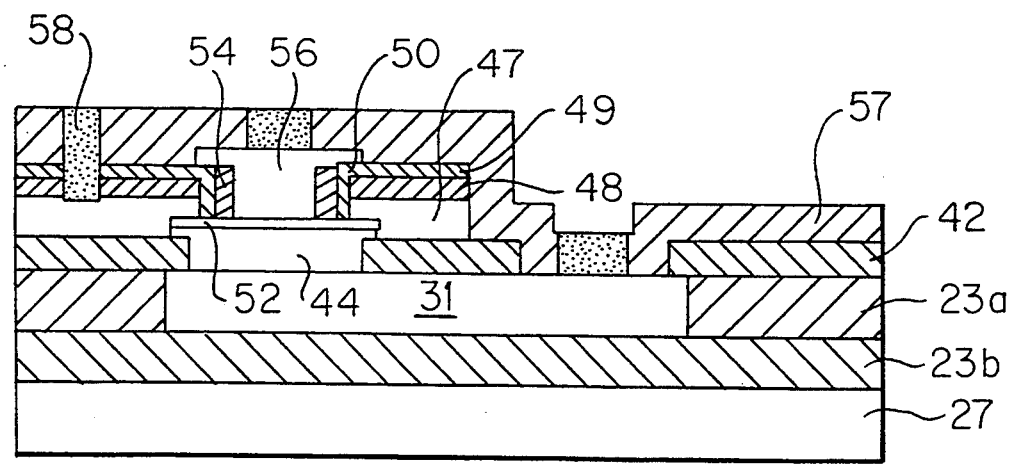
FIG. 4 is a cross-sectional view showing the construction of a bipolar transistor using the SOI substrate of FIG. 2.

Referring to FIG. 4, the bipolar transistor fabricated by the fabricating method of the present invention has an SOI substrate shown in FIG. 2, a patterned oxide layer 42 formed on a surface of the SOI substrate and having an opening on an active region, a collector 44 formed in the opening, an intrinsic base 52 formed on the collector 44 and formed between extrinsic bases 47, an insulating layer formed on the extrinsic base 47, an emitter 56 formed on the intrinsic base 52 and isolated from the extrinsic base 47 by a side wall, and electrodes formed thereon. Component elements having similar functions to the component elements of the SOI substrate of FIG. 2 are indicated by the same reference numerals, and descriptions thereof are omitted.

Figure 5A:
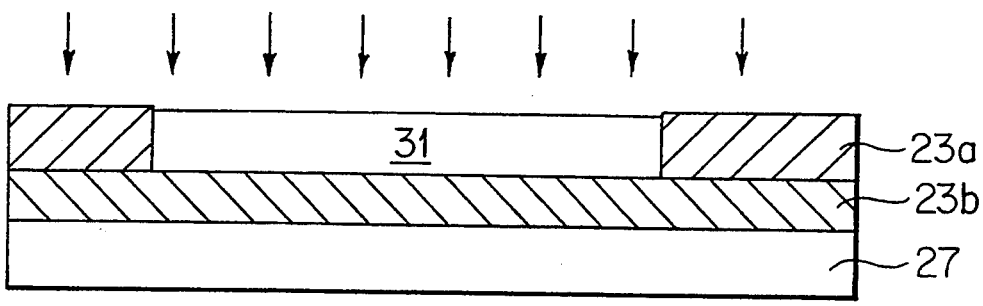
FIGS. 5A to 5H are cross-sectional views showing the steps of fabricating the bipolar transistor of FIG. 4.

First, as shown in FIG. 5A, an impurity of high concentration is injected into the active region to form a buried collector region 31. Then, the concentration is preferably more than $5 \times 10^{18} cm^{-3}$.

In this embodiment, the impurity injection may be omitted. For example, in case that the single crystal silicon layer is epitaxially grown in the opening as shown in FIG. 3A and at the same time an impurity is injected therein, the impurity injection as shown in FIG. 5A may be omitted.

Figure 5B:
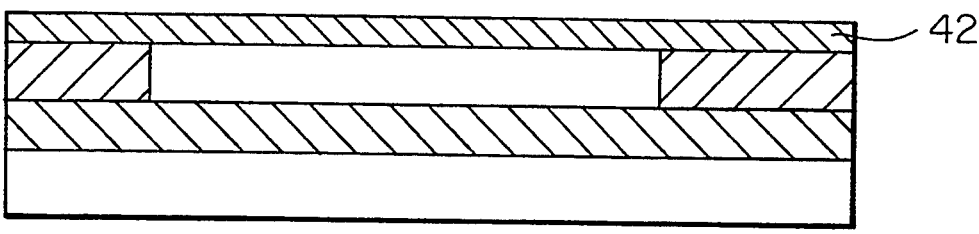
Figure 5C:
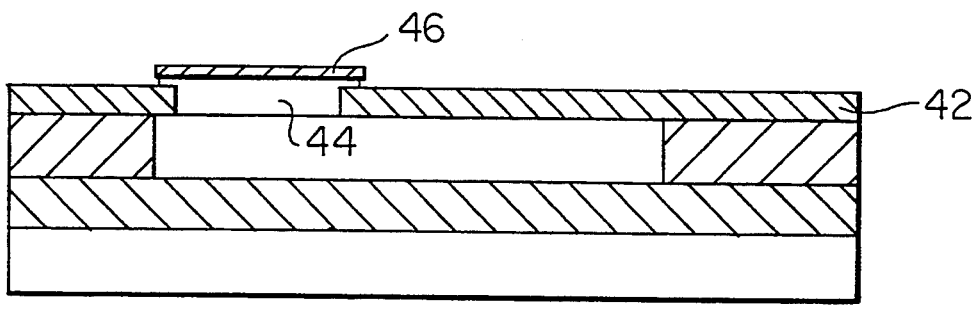

In FIG. 5B, an oxide layer 42 is grown on the planarized surface of the SOI substrate by a thermal-annealing or a chemical vapor deposition.

Next, the oxide layer 42 is patterned to define a collector region and an intrinsic base region, and the oxide layer 42 corresponding to the collector region is selectively etched back. Then, a collector 44 doped with an impurity is grown in the selectively etched portion, and a silicon oxide layer 46 is formed on the collector 44 by a thermal-annealing or a CVD (chemical vapor deposition), as shown in FIG. 9C. The silicon oxide layer 46 has the same thickness as a base.

Figure 5D:
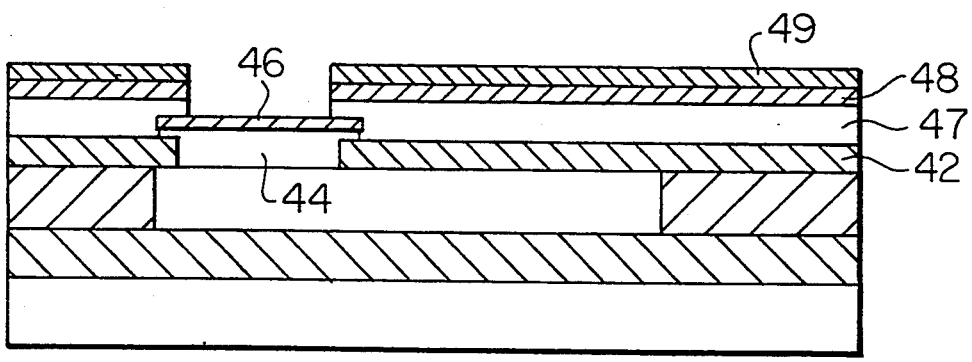
Figure 5E:
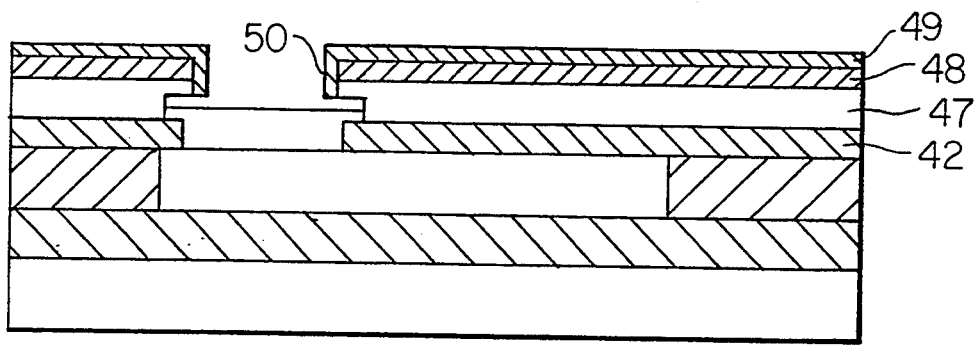

With reference to FIG. 5D, after sequentially forming an extrinsic base 47, a silicon oxide layer 48 and a nitride layer 49 thereon, they are selectively removed using a patterned photoresist layer (not shown) as an etching mask up to a surface of the silicon oxide layer 46. As a result, an opening is formed on the silicon oxide layer 46.

In this embodiment, the extrinsic base 47 is composed of a polysilicon and formed by a CVD, a plasma deposition or an MBE (molecular beam epitaxial growth).

If the SOI substrate is embodied in an n-p-n bipolar transistor, a BSG (boron silica glass) containing boron is used in place of the silicon oxide layer 48, and if it is embodied in a p-n-p bipolar transistor, a PSG (phosphorous silica glass) containing phosphorous is used in place of the silicon oxide layer 48. Also, in every case, a double layer composed of a polysilicon layer and a metal silicide layer is used in place of the single-layer extrinsic base 47 composed of polysilicon.

Figure 5F:
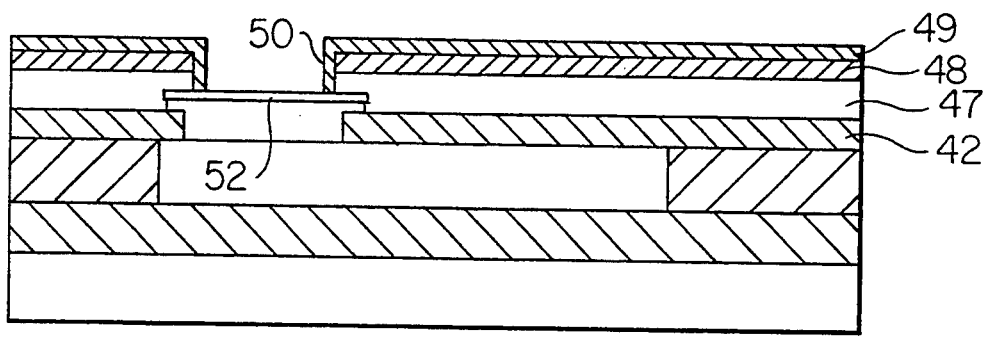

As shown in FIG. 9E, after formation of a first side wall 50 at both sides of the opening, the silicon oxide layer 46 on the collector 44 is removed by a well-known wet etching. Next, an intrinsic base 52 is formed at a region where the silicon oxide 46 is removed, as shown in FIG. 5F.

Figure 5G:
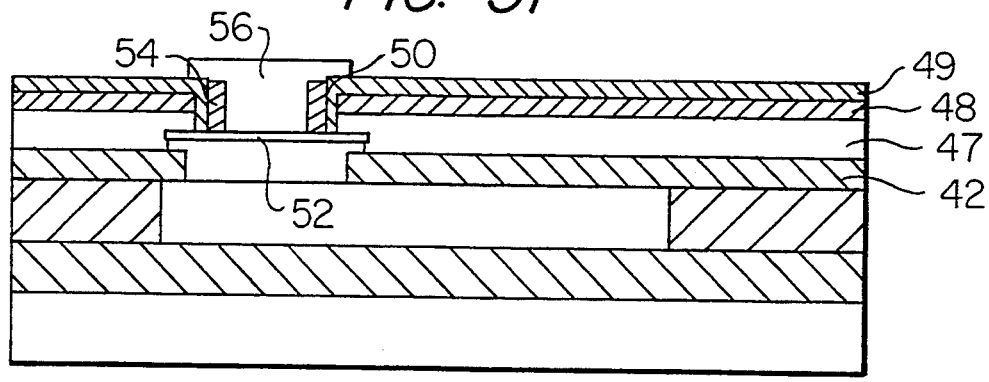

Subsequently, as shown in FIG. 5G, a second side wall 54 is formed on the first side wall 50 to define an emitter region, and then a polysilicon layer doped with an impurity of high concentration is deposited thereon. Also, the polysilicon layer is patterned to form an emitter 56. The extrinsic base 47 is isolated by the first side wall 50 in self-alignment, and the emitter 56 is isolated by the second side wall 54 in self-alignment.

Figure 5H:
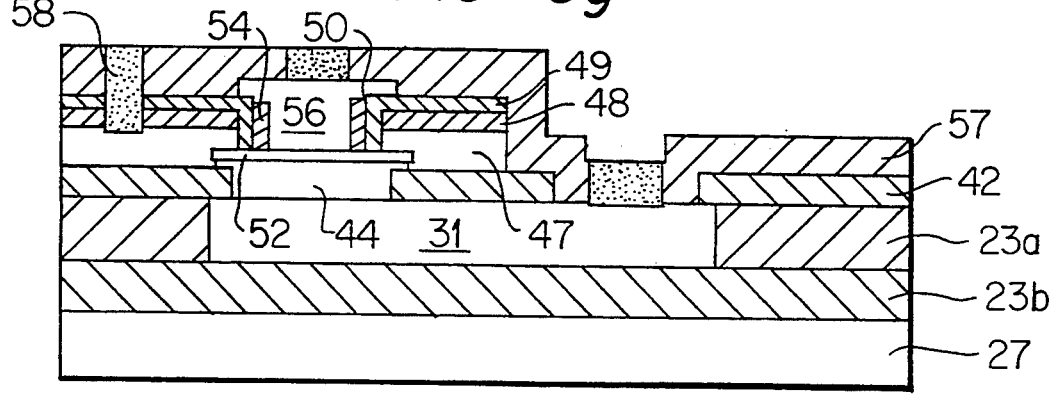

Finally, as shown in FIG. 5H, after formation of a passivation layer 57 thereon, a metallization is performed to form respective electrodes 58. As a result, the method of fabricating a bipolar transistor is completed.

In the bipolar transistor which is fabricated by the method of the present invention, a stray capacitance occurring between an SOI substrate and a metal wiring portion formed thereon can be significantly reduced owing to a relatively thick insulating layer therebetween, and a parasitic capacitance can be eliminated owing to an insulating layer interposed between a bonding substrate and an active region to be used as a buried collector.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for fabricating a semiconductor device, comprising the steps of:
   forming a first insulating layer on a single crystal silicon substrate;
   patterning the first insulating layer to form an opening;
   growing a single crystal silicon in the opening to form active and inactive regions;
   polishing the active region using the first insulating layer as a polishing stopper to form a planarized surface;
   depositing a second insulating layer on the planarized surface;
   bonding a bonding substrate to the second insulating layer; and
   polishing the silicon substrate using the first insulating layer as a stopper up to a surface of the active region.

2. The method according to claim 1, wherein the first insulating layer is composed of a multi-layer structure.

3. The method according to claim 2, wherein the multi-layer structure is formed by the step of sequentially forming a silicon oxide layer of about 500 Å thickness, a polysilicon layer of about 0.1 μm and a thick oxide layer on the silicon substrate.

4. A method for fabricating a semiconductor device, comprising the steps of:
   forming a first insulating layer on a single crystal silicon substrate;
   patterning the first insulating layer to form a first opening;
   growing a single crystal silicon in the first opening to form active and intrinsic regions;
   polishing the active region using the first insulating layer as a polishing stopper to form a planarized surface;
   depositing a second insulating layer on the planarized surface;
   bonding a bonding substrate to the second insulating layer;
   polishing the silicon substrate using the first insulating layer as a stopper up to a surface of the active region.
   introducing an impurity into the active region to form a buried collector region;
   depositing a patterned oxide layer having a second opening on the planarized surface;
   growing a single crystal silicon layer doped with an impurity in the second opening to form a collector;
   forming a silicide layer only on the collector;
   forming an extrinsic base only on a portion of the patterned oxide layer;
   depositing a third insulating layer having a third opening thereon, the third opening being formed on the silicide layer;
   forming a first side wall on both sides of the third opening;
   removing the silicide layer and forming an intrinsic base at a region where the silicide layer is removed;
   forming a second side wall on the first side wall;
   forming an emitter on the intrinsic base in the third opening; and
   forming electrodes to be respectively connected to the emitter, collector and base.

5. The method according to claim 4, wherein the step of injection the impurity comprises injecting the impurity having a concentration of more than $5 \times 10^{18} cm^{-3}$.

* * * * *